(12) United States Patent
Smith et al.

(10) Patent No.: US 11,616,053 B2
(45) Date of Patent: Mar. 28, 2023

(54) METHOD TO VERTICALLY ROUTE A LOGIC CELL INCORPORATING STACKED TRANSISTORS IN A THREE DIMENSIONAL LOGIC DEVICE

(71) Applicant: Tokyo Electron Limited, Tokyo (JP)

(72) Inventors: Jeffrey Smith, Clifton Park, NY (US); Anton J. Devilliers, Clifton Park, NY (US); Kandabara Tapily, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 41 days.

(21) Appl. No.: 16/559,923

(22) Filed: Sep. 4, 2019

(65) Prior Publication Data
US 2020/0075574 A1  Mar. 5, 2020

Related U.S. Application Data

(60) Provisional application No. 62/727,096, filed on Sep. 5, 2018.

(51) Int. Cl.
*H01L 29/417* (2006.01)
*H01L 27/02* (2006.01)
*H01L 27/092* (2006.01)

(52) U.S. Cl.
CPC ...... *H01L 27/0207* (2013.01); *H01L 27/0922* (2013.01); *H01L 27/0924* (2013.01)

(58) Field of Classification Search
CPC ............. H01L 27/0207; H01L 27/0924; H01L 27/0922; H01L 29/0673; H01L 29/0692; H01L 29/775; H01L 29/78696; H01L 29/42392; H01L 21/823871; H01L 27/092; H01L 27/0688; H01L 21/823807; H01L 21/823821; H01L 29/66439; H01L 21/8221; H01L 21/845; H01L 27/1211; H01L 29/0676; H01L 27/105; H01L 27/0705; B82Y 10/00
See application file for complete search history.

(56) References Cited

U.S. PATENT DOCUMENTS

| | | |
|---|---|---|
| 7,315,466 B2 | 1/2008 | Han et al. |
| 7,589,992 B2 | 9/2009 | Han et al. |
| 7,978,561 B2 | 7/2011 | Park et al. |

(Continued)

OTHER PUBLICATIONS

International Search Report and Written Opinion dated Jan. 3, 2020 in PCT/US2019/049687, 12 pages.

*Primary Examiner* — Samuel Park
(74) *Attorney, Agent, or Firm* — Oblon, McClelland, Maier & Neustadt, L.L.P.

(57) ABSTRACT

A semiconductor device includes: a substrate having a surface, the surface being planar; a first logic gate provided on the substrate and comprising a first field effect transistor (FET) having a first channel, and a first pair of source-drain regions; a second logic gate stacked over the first logic gate along a vertical direction perpendicular to the surface of the substrate, the second logic gate comprising a second FET having a second channel, and a second pair of source-drain regions; and a contact electrically connecting a source-drain region of the first FET to a source-drain region of the second FET such that at least a portion of current flowing between the first and second logic gate will flow along said vertical direction.

20 Claims, 8 Drawing Sheets

(56) References Cited

U.S. PATENT DOCUMENTS

| | | |
|---|---|---|
| 7,982,221 B2 | 7/2011 | Han et al. |
| 8,314,001 B2 | 11/2012 | Christensen et al. |
| 8,754,417 B2 | 6/2014 | Christensen et al. |
| 9,472,551 B2 | 10/2016 | Oxland |
| 9,941,200 B1 | 4/2018 | Roy |
| 9,966,416 B2 | 5/2018 | Zhao et al. |
| 10,049,946 B2 | 8/2018 | Oxland |
| 10,192,930 B2 | 1/2019 | Zhao et al. |
| 10,199,409 B2 | 2/2019 | Roy |
| 2006/0028861 A1 | 2/2006 | Han et al. |
| 2008/0089163 A1 | 4/2008 | Han et al. |
| 2008/0106953 A1* | 5/2008 | Madurawe ............... G11C 8/16 365/189.05 |
| 2009/0185407 A1 | 7/2009 | Park et al. |
| 2009/0224330 A1 | 9/2009 | Hong et al. |
| 2009/0294863 A1 | 12/2009 | Han et al. |
| 2011/0193136 A1* | 8/2011 | Moritoki ........... H01L 27/10811 257/E23.142 |
| 2011/0248349 A1 | 10/2011 | Christensen et al. |
| 2011/0266623 A1 | 11/2011 | Han et al. |
| 2012/0196432 A1* | 8/2012 | Yan ....................... H01L 29/665 438/586 |
| 2013/0001701 A1 | 1/2013 | Christensen et al. |
| 2013/0002303 A1* | 1/2013 | Viau ................. H03K 19/0948 326/121 |
| 2015/0116019 A1* | 4/2015 | Hsu .................... H03K 3/35625 327/203 |
| 2015/0130068 A1* | 5/2015 | Lin ......................... G11C 7/18 257/773 |
| 2015/0206555 A1* | 7/2015 | Yang ..................... G11C 5/063 365/51 |
| 2016/0240533 A1 | 8/2016 | Oxland |
| 2016/0293227 A1* | 10/2016 | Chi ....................... G11C 5/025 |
| 2017/0033021 A1 | 2/2017 | Oxland |
| 2017/0323931 A1 | 11/2017 | Zhao et al. |
| 2018/0090435 A1 | 3/2018 | Roy |
| 2018/0122846 A1 | 5/2018 | Roy |
| 2018/0219044 A1 | 8/2018 | Zhao et al. |
| 2018/0254351 A1* | 9/2018 | Jung ..................... H01L 27/281 |
| 2020/0388309 A1* | 12/2020 | Gupta ...................... G11C 7/12 |

* cited by examiner

BACKGROUND**

BACKGROUND**

BACKGROUND

BACKGROUND

METHOD TO VERTICALLY ROUTE A LOGIC CELL INCORPORATING STACKED TRANSISTORS IN A THREE DIMENSIONAL LOGIC DEVICE

INCORPORATION BY REFERENCE

This present disclosure claims the benefit of U.S. Provisional Application No. 62/727,096, filed on Sep. 5, 2018, which is incorporated herein by reference in its entirety.

FIELD OF THE INVENTION

The present disclosure relates to a method to significantly area-scale a logic standard cell through vertical routing of floating stacked transistors and source/drain electrodes.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors and devices are stacked on top of each other.

SUMMARY

The present disclosure relates to a semiconductor device including: a substrate having a surface, the surface being planar; a first logic gate provided on the substrate and comprising a first field effect transistor (FET) having a first channel, and a first pair of source-drain regions; a second logic gate stacked over the first logic gate along a vertical direction perpendicular to the surface of the substrate, the second logic gate comprising a second FET having a second channel, and a second pair of source-drain regions; and a contact electrically connecting a source-drain region of the first FET to a source-drain region of the second FET such that at least a portion of current flowing between the first and second logic gate will flow along said vertical direction.

The present disclosure additionally relates to a combination logic cell including: a substrate having a surface, the surface being planar; a plurality of logic gates stacked in relation to one another along a vertical direction perpendicular to the surface of the substrate; and a contact extending along said vertical direction and electrically connecting an output of one of said plurality of logic gates to an input of the other one of said plurality of logic gates such that at least a portion of current flowing between the plurality of logic gates will flow along said vertical direction.

The present disclosure additionally relates to a semiconductor device, including: a substrate; a first field effect transistor (FET) provided on the substrate in a first deck and including a first channel, a first gate structure, a first source electrode, and a first drain electrode; a second FET stacked vertically perpendicular to a plane of the substrate over top the first FET in a second deck, and including a first channel, a first gate structure, a first source electrode, and a first drain electrode; and a current source electrically connected to the first source electrode or first drain electrode of the first FET, wherein current provided by the current source flows through the first FET in the first deck, and current exiting the first source electrode of the first FET or first drain electrode of the first FET flows vertically upwards to the second deck into the first source electrode of the second FET or first drain electrode of the second FET.

The present disclosure also relates to a semiconductor device in which a first deck is comprised of more than one adjacent field effect transistors (FET) and corresponding source and drain electrodes; a second deck comprised of more than one adjacent field effect transistors (FET) and corresponding source and drain electrodes, wherein current provided from a current source flows through multiple FETs in the first deck, and current exiting a source electrode of the first deck flows vertically upward to a second deck.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1:
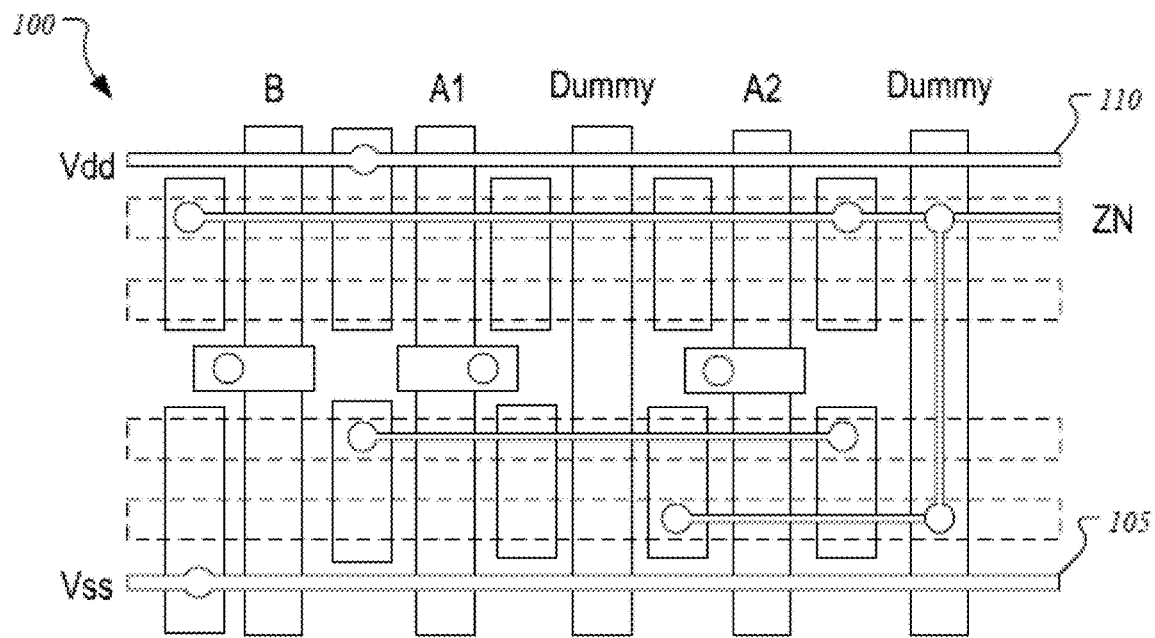
FIG. 1 shows a layout for a logic standard cell incorporating a buried Vss power rail and a buried Vdd power rail, according to an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Area scaling for CMOS devices is beginning to reach a limit to a point where, for 3 nm nodes, almost every conventional method to reduce track height of standard cells will be exhausted. Currently most standard cell designs are based on 6-7 track cell heights and aggressive work on so-called scaling boosters have laid out a path to eventually migrate down to 4 track cell heights. In order to accomplish this, a number of new integration solutions have been developed and are being adopted into the industry. Such solutions include (a) buried power rail, (b) contact-over active gate, (c) single diffusion cuts, (d) FIN population down to two FINs in both PMOS and NMOS with a desire to go down to single FIN for both NMOS and PMOS if variability can be solved, (e) full-self alignment of metal layers to vias.

It is believed that even for CFET devices, further reduction from a track height direction may prove difficult and that any scaling beyond this must come from reduction in the contacted gate pitch (CPP). Traditional scaling of CPP also has fundamental limits in which the physical gate size cannot extend down below 10 nm, and the low-k spacer used to keep dielectric separation between the metal gate and metal source and drain contacts need to be kept to a finite width.

Techniques herein pertain to a method to significantly area-scale a logic standard cell through vertically routing the device through a series of floating gates and source & drain electrodes which are stacked vertically overtop one another. Each transistor can be considered a "floor" or "deck" of the device and the current flow through the device extends from the lower "floor" or "deck" in which power is supplied to the device through buried power rails upwards in the device to the upper floors which can be connected to interconnect lines. This means that CPP pitch scaling can be done through stacking the transistors within a common standard cell on top of one another in a layered deck configuration. Accordingly, from an area-scale perspective, a single CPP is used although multiple transistors are stacked vertically within this common CPP space. For more complex standard cell designs which incorporate a greater number of transistors, a number of transistors can be placed on both the lower and upper decks such that some balance can be achieved between the total height of the transistor stacks which correlates to the initial monolithic fin height and the ratio of CPP reduction; hence, a standard cell comprised of, for example, six NMOS and six PMOS transistors can be incorporated into three decks each comprised of two adjacent common gates which include both NMOS and PMOS transistors.

FIG. 1 shows a layout for a logic standard cell 100 incorporating a buried Vss power rail 105 and a buried Vdd power rail 110, according to an embodiment of the disclosure. The logic standard cell 100, for example an AND-OR-Invert (AOI) cell, can be designed such that nFET and pFET run through a sequential series of gate and source and drain electrodes in which the current substantially progresses from one end to another, for example in an east/west or lateral direction (as shown). Given a planar substrate upon which structures are provided, the east/west or lateral direction can be interpreted as along a direction parallel to the plane of the substrate.

Figure 2:
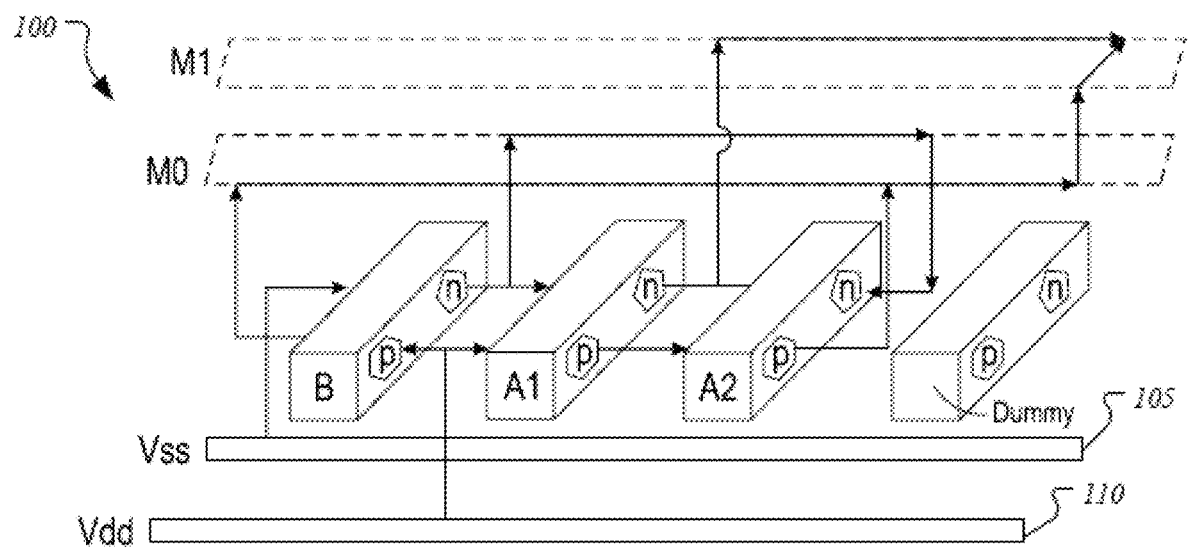
FIG. 2 shows a schematic of current flow through a logic standard cell, according to an embodiment of the disclosure.

FIG. 2 shows a schematic of current flow through the logic standard cell 100, according to an embodiment of the disclosure. For a CMOS device, nFET and pFET run laterally adjacent to one another through the logic standard cell 100 which can be laid out in the lateral direction (as shown) with respect to the general current flow. For simplicity, all connections to the actual gate electrodes are removed to focus on the current being supplied to the individual source and drain contacts.

Figure 3:
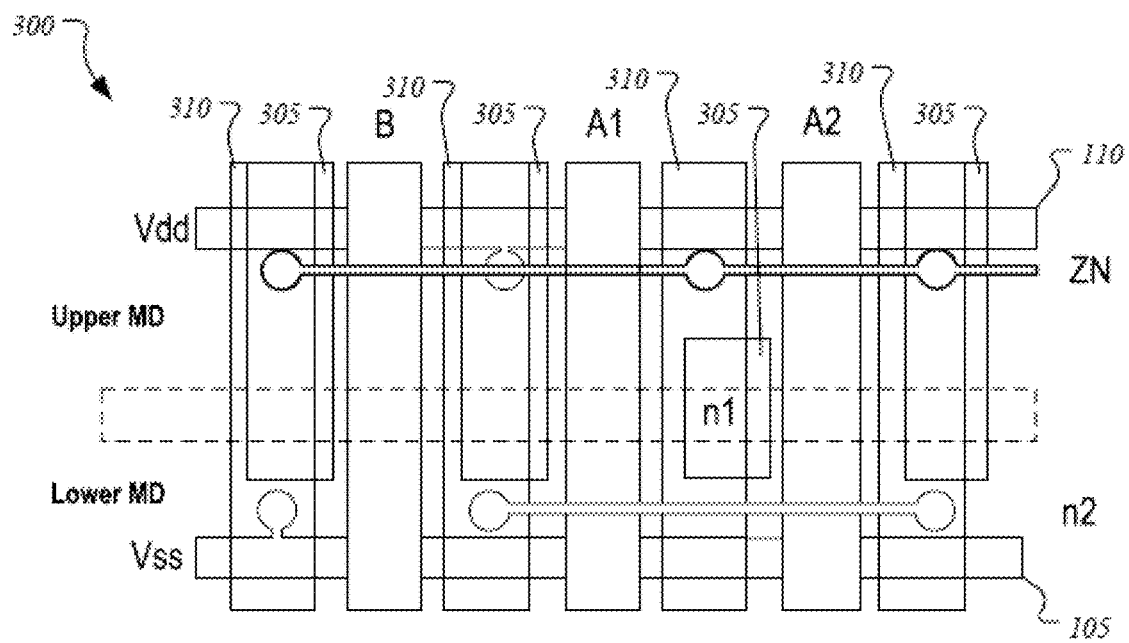
FIG. 3 shows a layout for an AOI standard cell incorporating complimentary FET (CFET) architecture in which NMOS and PMOS are stacked overtop one another, according to an embodiment of the present disclosure.

FIG. 3 shows a layout for an AOI standard cell 300 incorporating complimentary FET (CFET) architecture in which NMOS and PMOS are stacked overtop one another, according to an embodiment of the present disclosure. Another approach includes methods that enable CFET in which the nFET and pFET channels are stacked overtop one another, as opposed to laterally adjacent from one another, in an attempt to scale a north/south, or vertical, orientation of the standard cell by as much as, for example, 50%. Scaling boosters from conventional logic can be adopted for CFET as well in order to reduce the track height of the AOI standard cell 300 down to as few as 3 tracks, as shown in FIG. 3.

Figure 4:
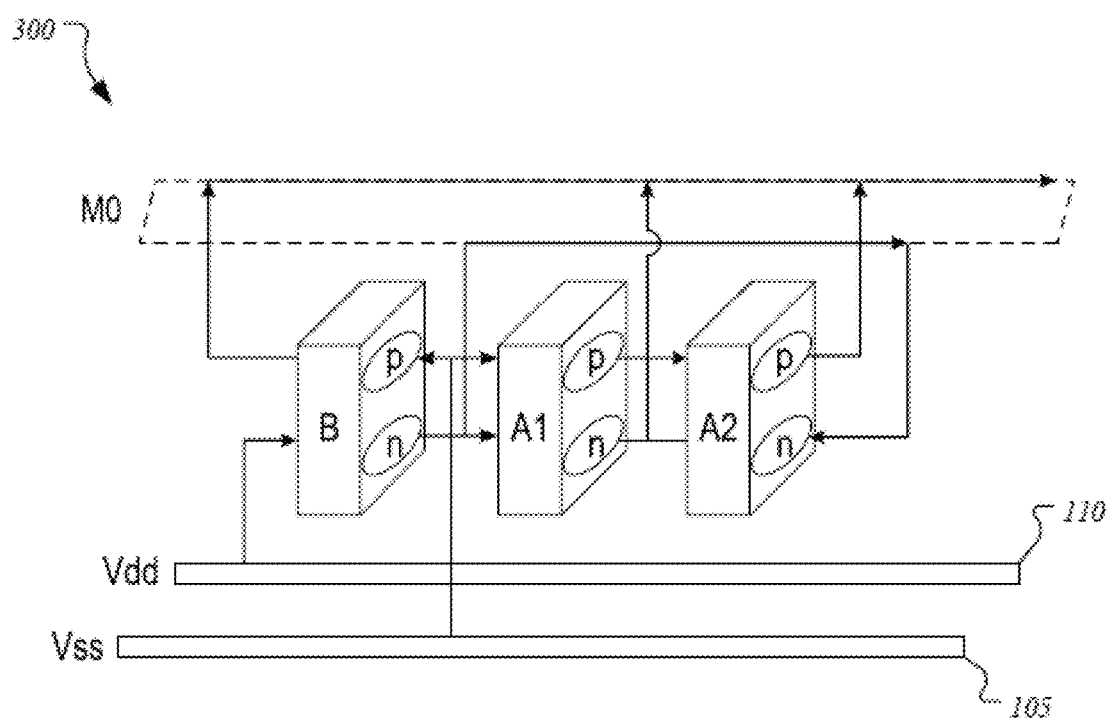
FIG. 4 shows a schematic of current flow through an AOI standard cell with stacked NMOS and PMOS, according to an embodiment of the present disclosure.

FIG. 4 shows a schematic of current flow through the AOI standard cell 300 with stacked NMOS and PMOS, according to an embodiment of the present disclosure. Stacking the source & drain electrodes enables sharing on common tracks between both NMOS and PMOS. This, coupled with the channels being stacked overtop one another, enables four track height AOI standard cells 300. As with conventional logic, the CFET current flow is still generally in the east/west direction; the primary difference compared to conventional logic is that for the case of CFET, the nFET and pFET currents are over-top one another. In another embodiment, a three track height AOI standard cell 300 may be enabled by using, for example, a mid-track handshake.

CFET uses the advantage of stacking the NMOS and PMOS channels directly overtop one another. For the case of a nanosheet CFET device, the cell height is not dominated by the need to accommodate multiple fin pitches, and since the source and drain and gate electrodes can be "staggered" or "stair-cased", connections can be made from either NMOS or PMOS to a common metal track in the back-end-of-line (BEOL), thus reducing the need to keep multiple tracks specific for routing between NMOS and PMOS. An example is shown in FIG. 3, where the ZN line makes connections to both PMOS source and drain contacts 305 and NMOS source and drain contacts 310.

Even with CFET devices, the CFET device is still composed of a series of gate and source & drain electrodes which run in the lateral direction. Considering effective current flow through the device, it is similar to the standard CMOS FET design, in which the current through nFET and pFET channels generally run in an east/west direction with the exception that both currents are running vertically over-top on another. With CFET being able to reduce track heights in the standard cell down to, for example, 3 or 4 tracks, the focus of continued scaling must therefore focus on reducing contacted gate pitch (CPP).

Techniques herein include a method for stacking gate structures such that the current flow within the standard cell can be routed upwards within a three-dimensional device as opposed to outward, for example as in a fin field effect transistor (FINFET) device. That is, the device can be layered into multiple decks or floors, such that each floor or deck can be a separate transistor and source and drain couple (see FIG. 5A).

Figure 5A:
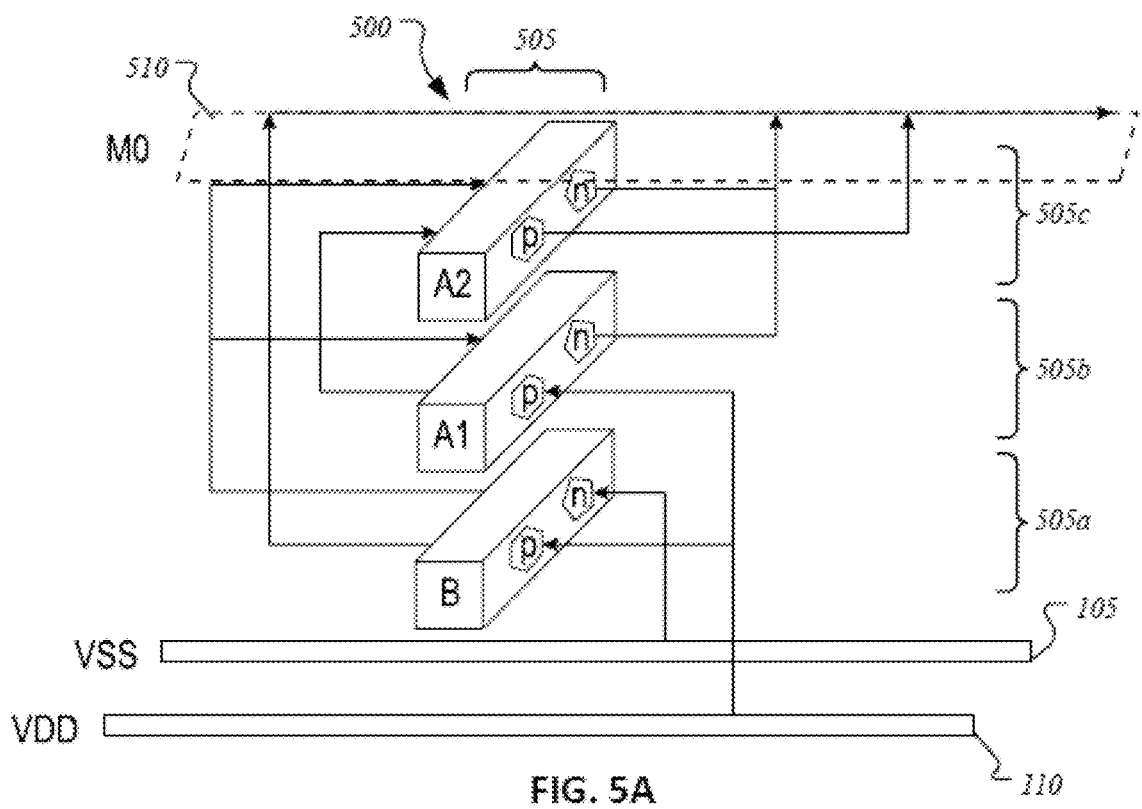
FIG. 5A shows a schematic for a vertically stacked gate cell incorporating vertically stacked transistors in which a lateral span of the standard cell fits within a single contacted gate pitch, according to an embodiment of the present disclosure.

FIG. 5A shows a schematic for a vertically stacked gate cell 500 incorporating vertically stacked transistors 505 in which a lateral span of the standard cell fits within a single contacted gate pitch, according to an embodiment of the present disclosure. In an embodiment, FIG. 5A shows internal wiring within the vertically stacked gate cell 500, which can be formed through internal via connections made between stacked source electrodes and stacked drain electrodes, as well as internal vias connecting a portion of the stacked source electrodes and a portion of the stacked drain electrodes to a metallization layer 510, or each floor or deck can be comprised of several transistor and source and drain contacts in order to scale the overall CPP of more complex standard cells.

Power to source and drain can be supplied through, for example, buried power rails. The power rail can supply the input going into the first transistor labelled B on the NMOS-side and through both B and A1 on the PMOS-side. The Vdd feed into two decks of the device can be achieved by forming a via connection between the first deck and second deck source and drain electrode on the PMOS-side. Alternatively, a given device can be created by simply merging or shorting the first and second deck PMOS source and drain electrode. In another example, power can alternatively be supplied from power rails at the metallization layer 510. For example, current flow can be sent downward through the decks comprising vertically stacked transistors 505 and source and drain electrodes and routed vertically to an output line connecting the bottom deck to an output track at the metallization layer 510.

The output of the first floor vertically stacked transistor 505 on the PMOS-side is then passed up to a metal line at the metallization layer 510, which can be used to combine the outputs throughout the vertically stacked gate cell 500, while the output on the NMOS side of the first deck transistor is then passed up to both the input on the second and third decks of the vertically stacked gate cell 500.

Figure 5B:
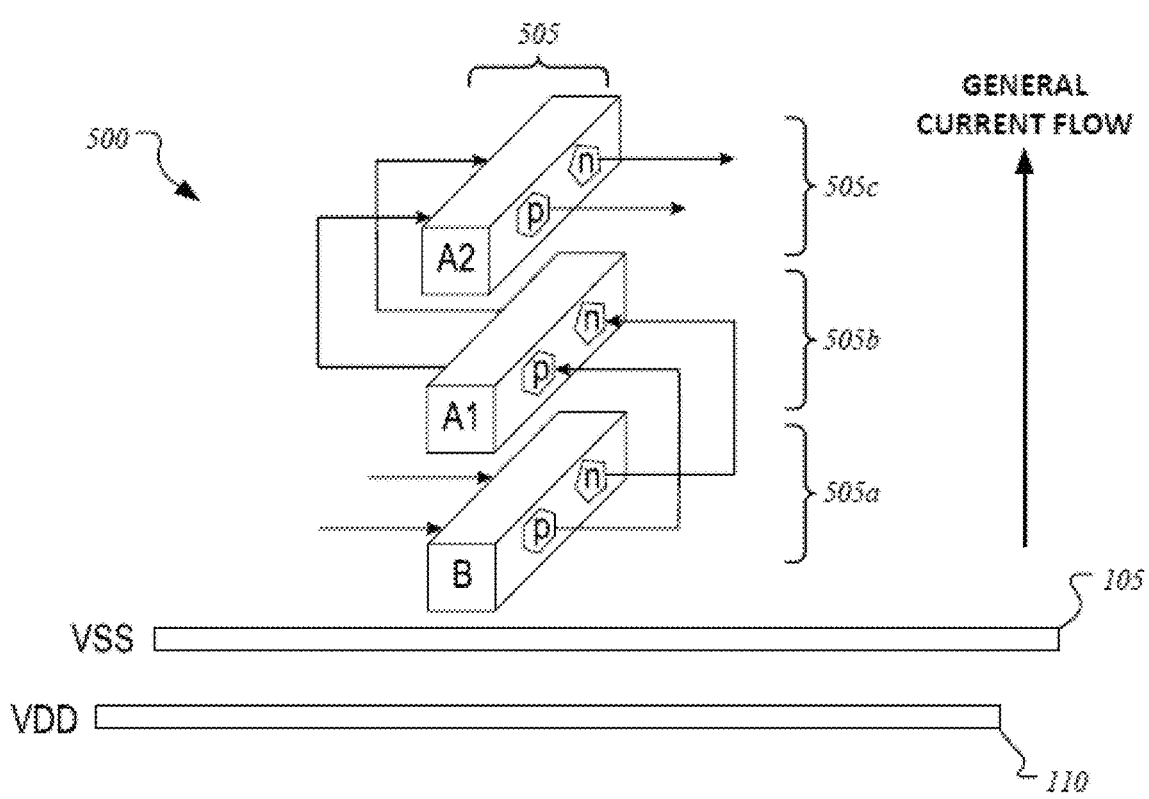
FIG. 5B shows current flow through a vertically stacked gate cell, according to an embodiment of the present disclosure.
Figure 5C:
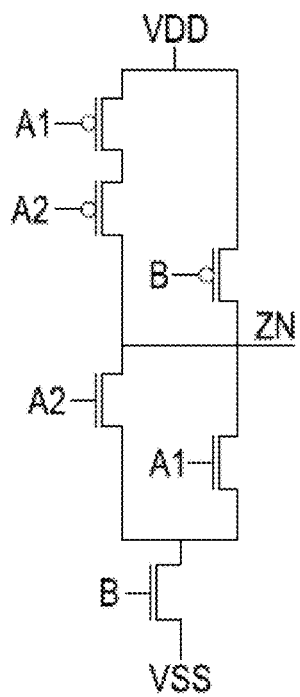
FIG. 5C shows a circuit diagram of a vertically stacked gate cell, according to an embodiment of the present disclosure.

FIG. 5B shows current flow through the vertically stacked gate cell 500, according to an embodiment of the present disclosure. FIG. 5C shows a circuit diagram of the vertically stacked gate cell 500, according to an embodiment of the present disclosure. In an embodiment, FIG. 5B demonstrates that the current no longer flows in the lateral direction across the entire cell, for example like the logic standard cell 100 of FIG. 2; rather, the current flow is only in the lateral direction across each of the vertically stacked transistors 505. Notably, general current flow is then directed vertically upward to the next deck or floor in which the current passes through the next vertically stacked transistor 505, and continues in this manner in an upward direction through the vertically stacked gate cell 500. For example, the vertically stacked transistors 505 can include a first vertically stacked transistor 505*a*, a second vertically stacked transistor 505*b*, and a third vertically stacked transistor 505*c*, wherein the first vertically stacked transistor 505*a* can be disposed beneath (and substantially or partially vertically aligned with) the second vertically stacked transistor 505*b*, and the second vertically stacked transistor 505*b* can be disposed beneath (and substantially or partially vertically aligned with) the third vertically stacked transistor 505*c*. The vertically stacked transistors 505 can include six source and drain electrodes (two source and drain disposed on each) and six channels disposed between pairs of the source and drain electrodes, all of which are staggered with respect to one another in order to provide connections both internally within vertically stacked gate cell 500 as well as from source and drain electrodes to routing tracks in the BEOL. Current can flow laterally through the first vertically stacked transistor 505*a*, for example from left to right (as shown) and be directed vertically upwards to flow through the second vertically stacked transistor 505*b* from right to left (as shown). This can subsequently be directed vertically upwards again to flow through the third vertically stacked transistor 505*c* from left to right again (as shown). Overall, this yields the current flow with generally upward vertical direction. It may be appreciated that more or less vertically stacked transistors 505 may be contemplated in the vertically stacked gate cell 500 and connected in such a way to electrically connect all the vertically stacked transistors 505.

Figure 7:
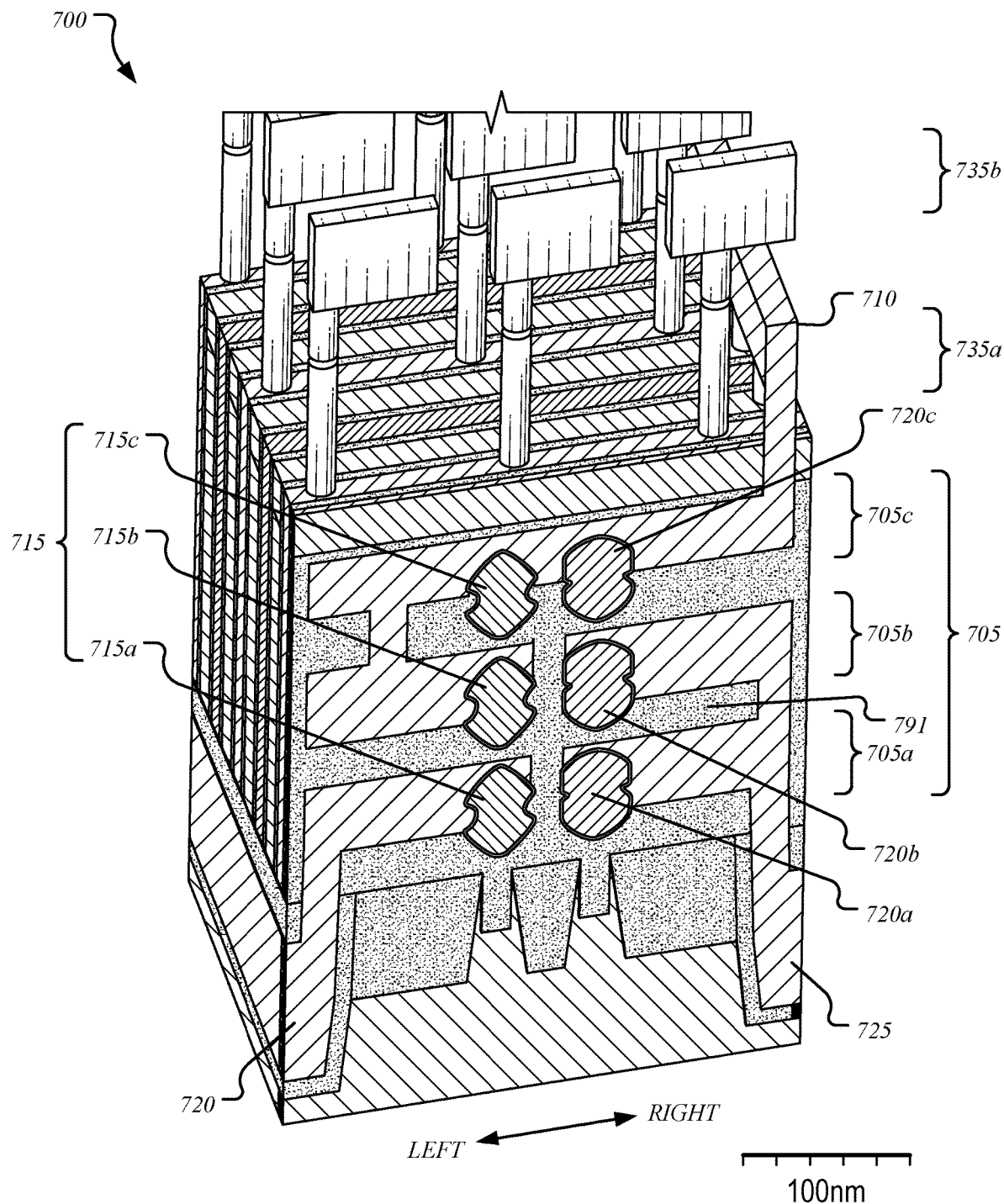
FIG. 7 shows a Vss and a Vdd input side view of a three deck vertically stacked gate cell, according to an embodiment of the present disclosure.
Figure 9:
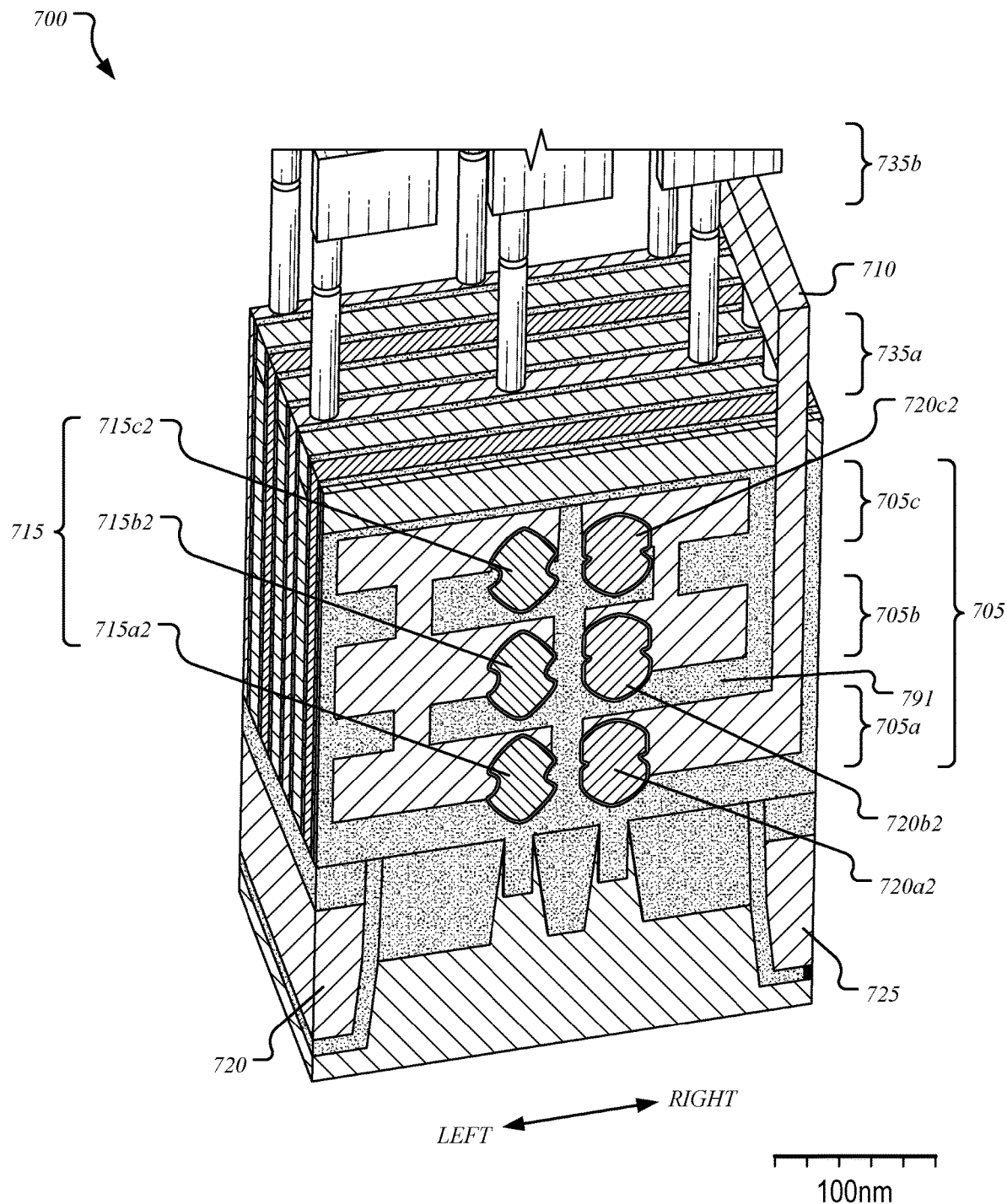
FIG. 9 shows a view of an NMOS S/D electrode and PMOS S/D electrode opposite the Vss and Vdd input side view of FIG. 7, according to an embodiment of the present disclosure.

Notably, the current flow progresses upward within the vertically stacked gate cell 500 by escalating up the floors or decks in which each deck is a separate vertically stacked transistor 505, which is physically separated from the vertically stacked transistor 505 below through incorporation of a dielectric film (e.g., a dielectric film 791, as shown in FIGS. 7 and 9). In the vertically stacked gate cell 500, each metal gate of the vertically stacked transistors 505 has a separate path in order to get input from an upper metal layer, so the gate electrodes are staggered or stair-cased in such a way that there are connection points to each of the vertically stacked transistor 505 to a separate metal track. In this way, a given vertically stacked gate cell 500 can reduce the CPP in lateral direction down to a single pitch. In order to accommodate the independent metal gate connections to the BEOL, a track height of the standard cell can be increased. Thus, while the vertically stacked gate cell 500 may not provide a direct, for example 50%, improvement in area scaling relative to a fully-scaled CFET device, it can provide some additional area scaling over CFET since some trade-off between how many CPP reductions are done versus what the ramifications would be to track height. For instance, typical CPP for 7 nm nodes can be as large as 50 nm, whereas the critical metal pitch for the same device would be on the order of 32 nm. Thus, any reduction of a single CPP with a trade-off of needing to extend the track height of the cell by 1 critical metal pitch still saves significant area.

In an embodiment, it can be beneficial to keep each vertically stacked transistor 505 electrically separated from one another, which can be achieved via (1) selective deposition of the high-k to the channel, (2) formation of the interstitial oxide between channel and high-k through driving oxygen through the high-k film, (3) selective deposition of metal liners, barriers, and work function materials directly onto the conductor materials that had been previously selective deposited onto the channel and not to the dielectric material within the opened replacement high-k metal gate (HKMG).

In an embodiment, incorporating anisotropically etched metal such as ruthenium or tungsten is used as the metal fill within the HKMG structure, thus enabling the formation of cuts directly into each gate "stack" of "deck" which enables the formation of the staggered gate pattern which provides independent access to the gates from metal layers in the BEOL.

In an embodiment, a metal can be incorporated into the HKMG stack which has ability to support selective deposition of dielectric film directly onto the metal surface. This can be beneficial for forming dielectric separation of a controlled amount between any two stacked vertically stacked transistors 505 in order to control capacitance between the vertically stacked transistors 505.

Common CMOS logic standard cell designs range in lateral CPP, or gate pitch. Lateral CPP can range as low as, for example, one for an inverter, to three to four for AOI cells, to more than twelve for multiplexer (MUX) and flop cells. Stacking, for example, twelve transistors over top one another can put significant strain in terms of the initial fin height (e.g. a silicon/silicon germanium fin) which can be used in the integration for the individual devices and nanosheet channels. Increasing this initial fin height can lead to manufacturing concerns association with fin-bending or variation between the sizes of the upper intended channel and lower channels within the fin superlattice, and the heights of these fins can be generally contained within a desired range of aspect ratios relative to the fin height and fin width.

In an embodiment, devices including more than three gates can use a two CPP stacked layout, wherein the stacking height of the device is kept to two or three decks, but can be stacked across two different sets of the vertically stacked transistors 505. This also enables a method for the case of multiple standard cells with varying gate counts on how to keep the overall layout close to the same deck height.

Figure 5D:
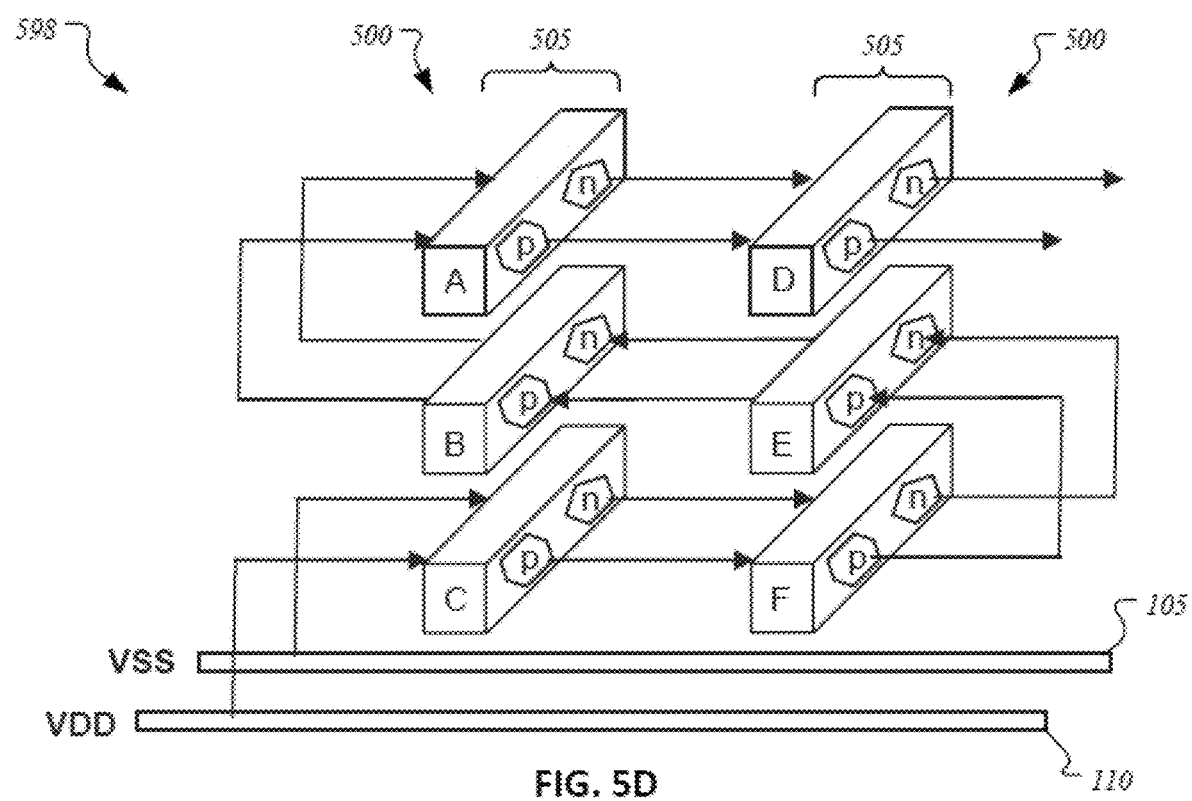
FIG. 5D shows current flow through a parallelized vertically stacked gate cell, according to an embodiment of the present disclosure.

In an embodiment, elements of east/west routing along with north/south routing can be combined. Instead of stacking all transistors within a standard cell on top of one another, a predetermined number of transistors can be vertically stacked into a predetermined number of vertical stacks, wherein each of the predetermined number of vertical stacks can relate to a predetermined CPP pitch. FIG. 5D shows current flow through a parallelized vertically stacked gate cell 598, according to an embodiment of the present disclosure. In an embodiment, the parallelized vertically stacked gate cell 598 can include a plurality of the vertically stacked gate cell 500, each of the vertically stacked gate cell 500 being disposed adjacent to each other along the lateral direction. Notably, current flow in the parallelized vertically stacked gate cell 598 still generally flows in the vertical direction, but may route laterally across sets of vertically stacked gate cells 500. For example, a six transistor logic cell (the parallelized vertically stacked gate cell 598) can be fabricated by using two sets of the vertically stacked gate cells 500, wherein each set of the vertically stacked gate cells 500 can include three vertically stacked transistors 505. The standard cell will have significant CPP reduction going from an initial "cell length" of seven CPP (including six transistors with one single-diffusion break between adjacent standard cells on both left-hand side and right-hand side) to a cell length of three CPP (including two vertically stacked gate cells 500 of three vertically stacked transistors 505 with one single-diffusion break between adjacent cells on both left-hand side and right-hand side).

An advantage of having multiple sets of vertically stacked transistors 505 within a cell design includes allowing for easier connection if the signal output from the drain-side of a source/drain contact is to be used as the input to a transistor, and the routing of such a signal would be significantly easier to do in terms of signal routing and complexity. In this example, the output from a drain-side source/drain on the lower deck or floor can be pulled up to the metallization layer 510 where it can then be easily passed into any of the vertically stacked transistors 505 within either of the vertically stacked gate cells 500 through a via-gate structure connecting to said transistor 505. Hence, each deck of the device can be designed to have a predetermined functionality that is then carried within the cell up to the next deck. It may be appreciated that more than two sets can be included in the parallelized vertically stacked gate cell 598 and each vertically stacked gate cells 500 can include more or less than three vertically stacked transistors 505. For example, 3, 100, or 1,000 sets of the vertically stacked gate cells 500 can be disposed adjacent to each other. For example, 2, 10, or 100 vertically stacked transistors 505 can be included in the vertically stacked gate cell 500.

Figure 5E:
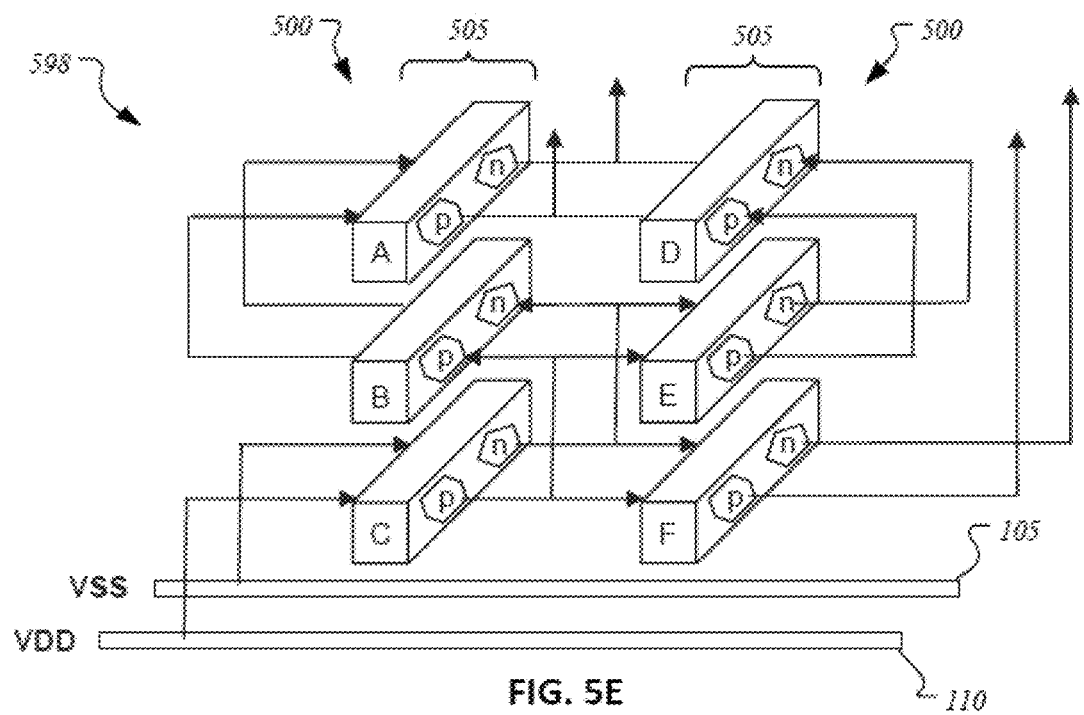
FIG. 5E shows mixed horizontal and vertical current flow through a parallelized vertically stacked gate cell, according to an embodiment of the present disclosure.

CMOS logic incorporates designs in which the output of a specific vertically stacked transistor 505 may be used as an input to several other transistors. In such designs, efficient signal routing from source/drain outputs to the input side of multiple source/drain contacts is desired. To remove inter-cell routing congestion within the parallelized vertically stacked gate cell 598, some of the routing congestion can be alleviated through the incorporation of routing elements within the vertically stacked interconnect structures themselves where vias connecting multiple decks of the parallelized vertically stacked gate cell 598 can have similar functionality as tracks from the metallization layer 510 within other cell designs. FIG. 5E shows mixed horizontal and vertical current flow through the parallelized vertically stacked gate cell 598, according to an embodiment of the present disclosure. In an embodiment, routing of an output signal from an output of the vertically stacked transistors 505 to multiple inputs can be performed through internal routing of interconnect structures within the device. Signal flow within each deck of the device can travel both east-to-west as well as west-to-east directions. For example, anytime that a signal output needs to route to an output track at the metallization layer 510, the signal can be pulled directly up to said metallization layer 510 track at the drain-side of the source/drain contact. For example, any time that the signal output needs to become an input to any of the vertically stacked transistors 505, the signal can likewise be pulled up to the metallization layer 510 track and then passed down to any of the vertically stacked transistors 505 that is configured to be functionalized by the input. For example, any time that the signal output is configured to pass through multiple transistors, the signal output can be routed to the deck in which both transistors are disposed and the signal can be sent to the two transistors.

Advantageously, this allows for multiple permutations to exist within a vertically stacked transistor design (i.e. the parallelized vertically stacked gate cell 598) for signal routing within a standard cell, and also provides for some potential improvement in the number of degrees of freedom that a future electronic design automation tool can have in terms of three-dimensional cell layout.

Notably, the vertically stacked gate cell 500 is different from a "vertical-FET" (VFET) device. VFET devices incorporate a common channel which runs vertically upward and has the gate and source and drain electrodes running perpendicular to the vertical channel. In such a device, incorporating internal routing between the source and drain contacts become problematic since all connections to the gate and source and drain electrodes need to be done laterally. According to the above-described vertically stacked gate cell 500 structure and current flow, the connections between the internal source and drain connections can be vertically accessed, which can provide significantly more scalability compared to VFET.

The limitation of VFET devices is that connecting to these gate and source and drain electrodes is challenging and often requires the electrodes to be very large in order to provide the multiple connection points up to the BEOL metal, thus diminishing any area benefit. The benefit of the vertically stacked gate cell 500 is that the vertically stacked transistors 505 still operate as normal, where the nanosheet or nano ring channels run laterally through the gate and the source and drain electrodes are internally wired such that the output of one of the vertically stacked transistors 505 on a lower floor or deck can be easily passed to the input of a vertically stacked transistor 505 on an upper floor or deck.

Figure 6:
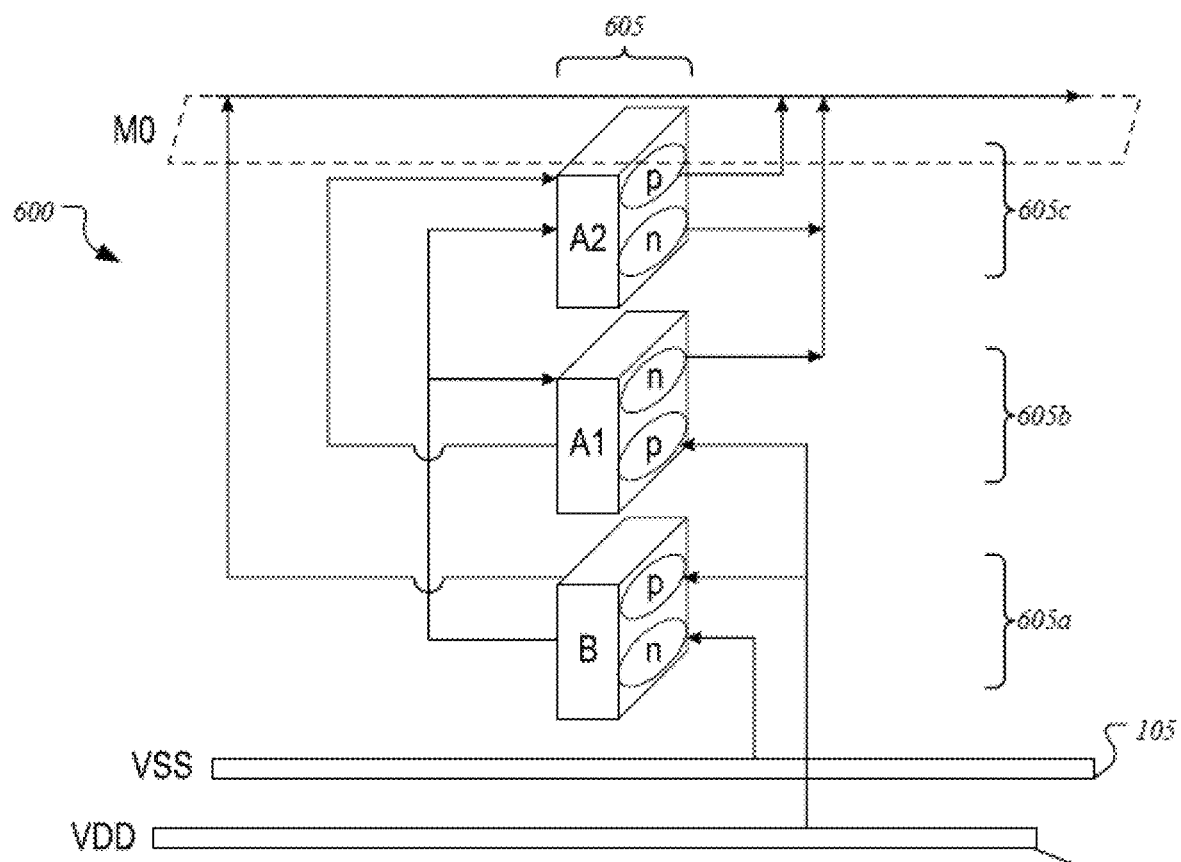
FIG. 6 shows a schematic of a vertically stacked gate cell with CFET-based stacked NMOS and PMOS architecture, according to an embodiment of the present disclosure.

FIG. 6 shows a schematic of a vertically stacked gate cell 600 with CFET-based stacked NMOS and PMOS architecture, according to an embodiment of the present disclosure. In an embodiment, the vertically stacked gate cell 500 can incorporate all of the elements mentioned above and also incorporate the nFET/pFET stacking concept from CFET architecture, thus yielding the vertically stacked gate cell 600 with CFET-based stacked NMOS and PMOS architecture. The vertically stacked gate cell 600 can include vertically stacked transistors 605, wherein the vertically stacked transistors 605 can include a first vertically stacked transistor 605a, a second vertically stacked transistor 605b, and a third vertically stacked transistor 605c, wherein the first vertically stacked transistor 605a can be disposed beneath (and substantially or partially vertically aligned with) the second vertically stacked transistor 605b, and the second vertically stacked transistor 605b can be disposed beneath (and substantially or partially vertically aligned with) the third vertically stacked transistor 605c. The vertically stacked transistors 605 can include six source and drain electrodes, all of which are staggered with respect to one another in order to provide connections both internally within vertically stacked gate cell 600 as well as from source and drain electrodes to routing tracks in the BEOL. This is an example of a six deck design. The current flow for the vertically stacked gate cell 600 is still in line with the multiple deck layout of the vertically stacked gate cell 500 in which the current is crossed through each of the vertically stacked transistors 505 before being elevated to the deck above it through internal via routing between the source and drain electrodes.

The following figures illustrate process emulation for better understanding.

FIG. 7 shows a Vss 720 and a Vdd 725 input side view of a three deck vertically stacked gate cell 700, according to an embodiment of the present disclosure. The Vss input 720 can be disposed on the left-hand side of the vertically stacked gate cell 700 and can supply a first NMOS source/drain (S/D) electrode 715a on a first deck 705a, while the Vdd input 725 can be disposed on the right-hand side of the vertically stacked gate cell 700 and can supply a first PMOS S/D electrode 720a on the first deck 705a and a second PMOS S/D electrode 720b on a second deck 705b, wherein the second deck 705b can be disposed over top the first deck 705a and a third deck 705c can be disposed over top the second deck 705b. The vertically stacked gate cell 700 can also include a second NMOS S/D electrode 715b, a third NMOS S/D electrode 715c, and a third PMOS S/D electrode 720c. The decks 705 in this figure can be connected, or internally routed, through the incorporation of internal vias, although other methods can be used to accomplish this, such as making a common S/D electrode that covers multiple decks 705. Notably, some functions typically done by metal routing, such as nFET to pFET connection, can easily be done through laterally shorting two adjacent NMOS and PMOS S/D contacts, for example the third NMOS S/D electrode 715c and the third PMOS S/D electrode 720c (as shown), thus providing a singular output to a metal track 710 that can be disposed in a first metal layer 735a.

Figure 8:
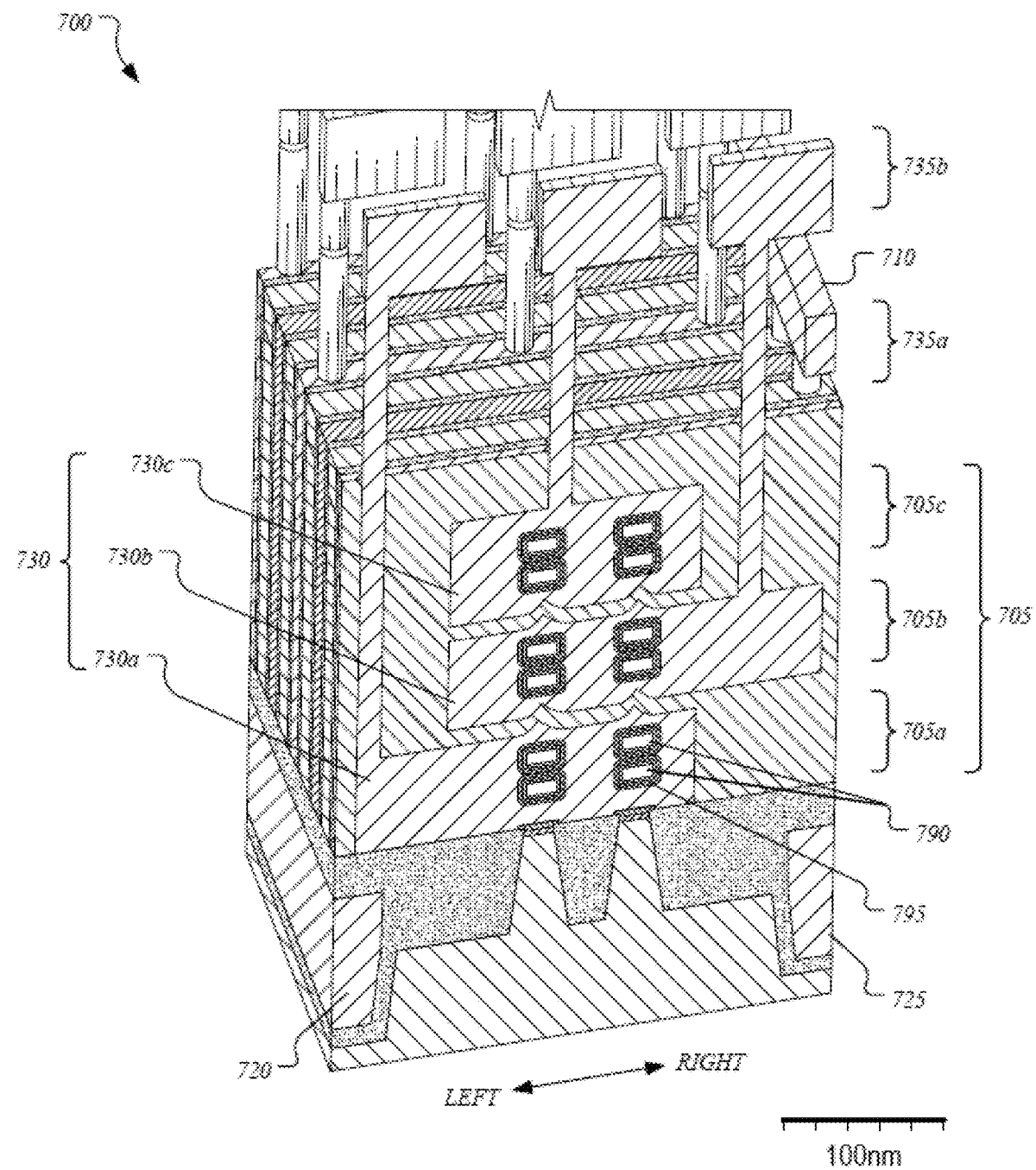
FIG. 8 shows a transistor side view of a three deck vertically stacked gate cell, according to an embodiment of the present disclosure.

FIG. 8 shows a gate-side view of the three deck vertically stacked gate cell 700, according to an embodiment of the present disclosure. Vertically stacked transistors 730, including a first vertically stacked transistor 730a, a second vertically stacked transistor 730b, and a third vertically stacked transistor 730c, can occupy each deck 705 of the vertically stacked gate cell 700. As shown, the vertically stacked transistors 730 can be common between NMOS and PMOS, although work function metals 795 surrounding channels 790 can be different between physical NMOS and PMOS gates. The vertically stacked transistors 730 can be supplied by a second metal layer 735b and each connection down from the second metal layer 735b feeds into an independent vertically stacked transistor 730 through staggering of the vertically stacked transistors 730 on each deck 705 in order to enable a landing area to each input to the vertically stacked transistors 730 from the second metal layer 735b.

FIG. 9 shows a view of the NMOS S/D electrodes 715 and PMOS S/D electrodes 720 opposite the Vss 720 and Vdd 725 input side view of FIG. 7, according to an embodiment of the present disclosure. In this view, the vertically stacked gate cell 700 can include a first NMOS S/D electrode output 715a2, a second NMOS S/D electrode output 715b2, a third NMOS S/D electrode output 715c2, a first PMOS S/D electrode output 720a2, a second PMOS S/D electrode output 720b2, and a third PMOS S/D electrode output 720c2. As can be seen on the first deck 705a, the first PMOS S/D electrode output 720a2 in the first vertically stacked transistor 730a on the PMOS (right) side can pull up to the metal track 710, while the first NMOS S/D electrode output 715a2 from the first vertically stacked transistor 730a on the NMOS (left) side can pull up to the second NMOS S/D electrode output 715b2 of the second vertically stacked transistor 730b on the second deck 705b and the third NMOS S/D electrode output 715c2 of the third vertically stacked transistor 730c on the third deck 705c. Thus, the first NMOS S/D electrode output 715a2 can be used as an input source for the second vertically stacked transistor 730b and the third vertically stacked transistor 730c.

In another embodiment, the vertically stacked gate cell 700 can be configured where NMOS and PMOS source and drain areas are also stacked overtop one another in CFET fashion. This configuration results in a device in which there are six decks 705 as opposed to three, in which the decks 705 can be determined by the S/D electrode while the common gate can occupy two adjacent decks 705.

Accordingly, techniques described can drive area scaling through stacking multiple independent gates overtop one another in order to drive the east/west or lateral area of a standard cell down to a fewer number of CPP (contacted poly pitches).

Advantages of the aforementioned embodiments are described as follows.

The area of a given device can be scaled in an east/west or lateral direction through reducing the number of CPP needed for the device through a configuration in which the gates are stacked vertically overtop one another. Accordingly a number of transistors in the device remains constant by stacking of the gates, which realizes a size benefit to the standard cell.

Each gate and source and drain electrode can serve as a separate "floor" or "deck" of the total device. Current flowing through the device is routed upward through the escalating "floors" or "decks" of the device through either (a) internal vias which can connect source and drain contact across multiple decks, or (b) through physically merging source and drain electrodes from two separate decks into a single, merged electrode. Thus, what is typically done through routing in the back-end of line (BEOL) through metal interconnect can be done internally through incorporation of vias or merged or shorted source and drain contacts.

Gates can be sized and staggered with respect to one another within the device so that connection to each gate can be made clearly from any BEOL metal layer.

The source and drain electrodes can also be staggered with respect to one another with the intent to provide access to pull up to any metal track within the device at any time in order to bypass the internal routing going up the escalating decks of a given device.

Current flow through a device is generally upward, where the supply can come from a buried power rail or from a power rail in the BEOL with a supply going to a source and drain electrode on a lower deck of the device. From here the current will pass through the transistor and feed into the neighboring source and drain electrode, where the output can either be passed upward to a metal routing track or up to the next "deck" of the device where the output from the lower deck can serve as an input to an upper deck. The current will pass through the transistor on this deck and then pass into a next source and drain electrode and then again is either passed up to a metal routing track or supplied an incoming supply for the next deck/transistor.

Embodiments herein can include a single CPP (contacted gate/poly pitch) in terms of area scaling in the east/west direction of the standard cell. Although multiple gates are used, the gates are stacked overtop one another to drive to a small area size.

To accommodate multiple stacking of the gates, a cell height in the north/south, or vertical, orientation can be increased to allow for the staggered connections to the stacked gates. CPP can be much larger compared to critical metal pitch, so a change of one CPP can be often anywhere from 25% to 50% more in terms of physical size than any change in track cell height. For example, a one CPP reduction could be as much as, for example 42 nm, but to achieve this, an added track pitch may need to be added to the standard cell which may be on the order of, for example, 24 nm, so the actual benefit in this example case could be, for example, 18 nm.

For devices which contain more than three gates, it is possible to use a two CPP stacked layout, wherein the stacking height of the device is kept to two or three decks, but are done so across two different sets of stacked gates. This also enables a method for the case of multiple standard cells with varying gate counts on how to keep the overall layout close to the same deck height.

NMOS and PMOS channels can run side-by-side with respect to one another in this device, as is common in CMOS, so the example AOI cell (previously mentioned) can comprise a three deck device. Alternatively, the NMOS and PMOS channels themselves can be stacked overtop one another in a complimentary FET (CFET) device which would make this device method into a six deck device.

This device concept can enable standard cell-on-standard cell or chip-on-chip three dimensional devices because the upward scaling path does not need to be limited in the vertical direction and some routing between cells can still be created internally between the output of two cells which are vertically stacked overtop of one another.

In embodiments described, all gates can be common gates in which NMOS and PMOS channels pass through the same gate structure within each deck of the device, but within each common gate, the work function metals deposited over the channel are specific to the channel (NMOS metals deposited on the NMOS channel, PMOS metals deposited on the PMOS channel). Alternatively, split gates can be incorporated such that only NMOS gates can be used for NMOS channels and independent PMOS gates can be used for PMOS channels. In this embodiment, NMOS and PMOS gate electrodes can be physically and electrically isolated from one another by formation of a dielectric film which can either be directly deposited onto one or both of the gate electrodes, or through a selective deposition method to uncovered/covered gate electrodes.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
a substrate having a surface, the surface being planar;
a first logic gate provided on the substrate and comprising a first field effect transistor (FET) having a first channel, and a first pair of source-drain regions;
a second logic gate stacked over the first logic gate along a vertical direction perpendicular to the surface of the substrate, the second logic gate comprising a second FET having a second channel, and a second pair of source-drain regions;
a dielectric film formed between the first logic gate and the second logic gate and separating the first logic gate from the second logic gate; and
a first contact extending from a first source-drain electrode of the first FET to a second source-drain electrode of the second FET such that at least a portion of current flowing between the first and second logic gates will flow along the vertical direction,
wherein the first source-drain electrode of the first FET is partially embedded in the dielectric film and partially embedded in the first contact.

2. The semiconductor device of claim 1, wherein
said first logic gate comprises a first set of complementary FETs including said first FET; and
said second logic gate comprises a second set of complementary FETs including said second FET.

3. The semiconductor device of claim 2, wherein at least one of said first and second sets of complementary FETs comprises laterally arranged complementary FETS spaced from one another in a lateral direction along said surface of the substrate.

4. The semiconductor device of claim 2, wherein at least one of said first and second sets of complementary FETs comprises stacked complementary FETS spaced along said vertical direction.

5. The semiconductor device of claim 1, further comprising a power rail configured to provide current to said first and second logic gate, wherein said power rail comprises a back end of line (BEOL) power rail positioned over said second logic gate along said vertical direction.

6. The semiconductor device of claim 1, further comprising a power rail configured to provide current to said first and second logic gate, wherein said power rail comprises a buried power rail positioned below said first logic gate along said vertical direction.

7. The semiconductor device of claim 1, further comprising:
a third logic gate provided on the substrate laterally adjacent to the first logic gate and comprising a third FET having a third channel, and a third pair of source-drain regions;
a fourth logic gate stacked over the third logic gate along said vertical direction perpendicular to the surface of the substrate, the fourth logic gate comprising a fourth FET having a fourth channel, and a fourth pair of source-drain regions;
a second contact electrically connecting a third source-drain region of the third FET to a fourth source-drain region of the fourth FET such that at least a portion of current flowing between the third and fourth logic gate will flow along said vertical direction; and
a third contact electrically connecting a source-drain region of the first pair of source drain regions to a source-drain region of the third pair of source-drain regions such that at least a portion of current flowing between the first and third logic gate will flow along a lateral direction.

8. The semiconductor device of claim 1, further comprising:
a third logic gate stacked over the second logic gate along said vertical direction, the third logic gate comprising a third FET having a third channel, and a third pair of source-drain regions; and
a second contact electrically connecting a source-drain region of the second pair of source-drain regions to a source-drain region of the third pair of source-drain regions such that at least a portion of current flowing between the second and third logic gate will flow along said vertical direction.

9. A combination logic cell comprising:
a substrate having a surface, the surface being planar;
a plurality of logic gates stacked in relation to one another along a vertical direction perpendicular to the surface of the substrate and separated from one another by a dielectric film; and
a contact extending along the vertical direction from an output of one of the plurality of logic gates to an input of the other one of the plurality of logic gates such that at least a portion of current flowing between the plurality of logic gates will flow along the vertical direction,
wherein an output source-drain electrode of a first logic gate of said plurality of logic gates or an input source-drain electrode of a second logic gate of said plurality of logic gates is partially embedded in the dielectric film and partially embedded in the contact.

10. The combinational logic cell of claim 9, wherein said plurality of logic gates occupy a single contacted gate pitch in a first direction along said surface of the substrate.

11. The combinational logic cell of claim 10, wherein said plurality of logic gates occupy more than one critical metal pitch in a second direction along said surface of the substrate and non-parallel to said first direction.

12. The combinational logic cell of claim 10, wherein
said plurality of logic gates comprises three logic gates stacked in relation to one another along said vertical direction; and
said contact comprises a plurality of contacts configured to electrically interconnect said plurality of logic gates in a configuration of an AND-OR-Invert (AOI) cell.

13. A semiconductor device, comprising:
a substrate;
a first field effect transistor (FET) provided on the substrate in a first deck and including a first channel, a first gate structure, a first source electrode, and a first drain electrode;
a second FET stacked vertically perpendicular to a plane of the substrate on top of the first FET in a second deck, and including a first channel, a first gate structure, a first source electrode, and a first drain electrode;
a dielectric film formed between the first FET and the second FET and separating the first FET from the second FET;
a contact extending from the first source electrode of the first FET to the first source electrode of the second FET or connecting the first drain electrode of the first FET to the first drain electrode of the second FET such that at least a portion of current flowing between the first FET and the second FET will flow along the vertical direction; and
a current source electrically connected to the first source electrode or first drain electrode of the first FET, wherein
current provided by the current source flows through the first FET in the first deck,
current exiting the first source electrode of the first FET or first drain electrode of the first FET flows vertically upwards to the second deck into the first source electrode of the second FET or the first drain electrode of the second FET,
and
at least one of the first source electrode and the first drain electrode of the first FET and the first source electrode and the first drain electrode of the second FET is partially embedded in the dielectric film and partially embedded in the contact.

14. The device of claim 13 further comprising additional FETs, each additional FET being stacked overtop one another in additional decks.

15. The device of claim 13, wherein
the first FET is part of a first complementary FET (CFET) and the second FET is part of a second CFET;
the first CFET includes a second channel, a second gate structure, a second source electrode, and a second drain electrode;
the second CFET includes a second channel, a second gate structure, a second source electrode, and a second drain electrode;
a first channel of the first CFET provides an NMOS channel and the second channel of the first CFET provides a PMOS channel;
a first channel of the second CFET provides an NMOS channel and the second channel of the second CFET provides a PMOS channel.

16. The device of claim 15, wherein
the second channel of the first CFET is disposed laterally adjacent to the first channel of the first CFET; and
the second channel of the second CFET is disposed laterally adjacent to the first channel of the second CFET.

17. The device of claim 15, wherein
the second channel of the first CFET is disposed vertically over top the first channel of the first CFET; and
the second channel of the second CFET is disposed vertically over top the first channel of the second CFET.

18. The device of claim 17, wherein:
said second gate structure is stacked vertically perpendicular to the plane of the substrate over top the first gate structure, and
said first and second gate structures include respective gate electrodes which are staggered in relation to one another in a lateral direction along said plane of the substrate.

19. The semiconductor device of claim 1, wherein the second source-drain electrode of the second FET is partially embedded in the dielectric film and partially embedded in the first contact.

20. The combination logic cell of claim 9, wherein both the output source-drain electrode of the first logic gate and the input source-drain electrode of the second logic gate are partially embedded in the dielectric film and partially embedded in the contact.

* * * * *

UNITED STATES PATENT AND TRADEMARK OFFICE
CERTIFICATE OF CORRECTION

PATENT NO. : 11,616,053 B2
APPLICATION NO. : 16/559923
DATED : March 28, 2023
INVENTOR(S) : Smith et al.

It is certified that error appears in the above-identified patent and that said Letters Patent is hereby corrected as shown below:

In the Claims

In Column 15, Claim 10, Line 3, delete "combinational" and insert -- combination --, therefor.

In Column 15, Claim 11, Line 6, delete "combinational" and insert -- combination --, therefor.

In Column 15, Claim 12, Line 10, delete "combinational" and insert -- combination --, therefor.

In Column 15, Claim 13, Line 48, delete "and" and insert the same at Line 47, after "FET," as a continuation point.

Signed and Sealed this
Twenty-first Day of November, 2023

*Katherine Kelly Vidal*

Katherine Kelly Vidal
*Director of the United States Patent and Trademark Office*